United States Patent [19]

Vinegar et al.

[11] Patent Number: 4,719,423
[45] Date of Patent: Jan. 12, 1988

[54] NMR IMAGING OF MATERIALS FOR TRANSPORT PROPERTIES

[75] Inventors: Harold J. Vinegar, Houston; William P. Rothwell, Katy, both of Tex.

[73] Assignee: Shell Oil Company, Houston, Tex.

[21] Appl. No.: 765,407

[22] Filed: Aug. 13, 1985

[51] Int. Cl.$^4$ ............................................. G01R 33/20
[52] U.S. Cl. ..................................... 324/303; 324/307
[58] Field of Search ............... 324/300, 303, 306, 307, 324/309

[56] References Cited

U.S. PATENT DOCUMENTS

| | | | |
|---|---|---|---|
| 2,887,673 | 5/1959 | Hahn | 324/307 |
| 4,408,161 | 10/1983 | Brown | 324/303 |
| 4,424,487 | 1/1984 | Lauffer | 324/303 |
| 4,567,440 | 1/1986 | Haselgrove | 324/309 |

OTHER PUBLICATIONS

Analogy Between Diffusion and Electrical Conductivity in Porous Rocks, L. J. Klinkenberg, Bull. of Geol. Soc. of Am., 6/81, vol. 62, pp. 559–564.
NMR Spin–Echo Self-Diffusion Measurements on Fluids Undergoing Restricted Diffusion, D. E. Woessner, J. Phys. Chem., vol. 67, pp. 1365–1367 (1963).
Restricted Self-Diffusion of Protons in Colloidal Systems by the Pulsed–Gradient, Spin–Echo Method, Tanner and Stejskal, Jour. Chem. Phy., vol. 49, No. 4, (1968), pp. 1768–1777.
Molecular Transport Through Assemblages of Microporous Particles, Kocirik and Zikanova, Jour. of Colloid and Inter. Sci., vol. 84, No. 1, 11/81, pp. 240–249.
A Review of Diffusion and Dispersion in Porous Media, Perkins and Johnston, Soc. of Pet. Engin. Jour., Mar. 1963, pp. 70–84.

*Primary Examiner*—Stewart J. Levy
*Assistant Examiner*—Kevin D. O'Shea

[57] ABSTRACT

NMR imaging methods are provided for determining spatial diffusion coefficients, formation resistivity factors, mean pore size, and permeability of a porous material. The imaging methods employ a constant magnetic field and two images are obtained for the material, one with a non-imaging gradient and one without a non-imaging gradient. These images are combined to produce diffusion coefficients.

9 Claims, 5 Drawing Figures

NMR IMAGING OF MATERIALS FOR TRANSPORT PROPERTIES

BACKGROUND OF THE INVENTION

This invention relates to NMR imaging and more particularly relates to NMR imaging of samples of materials to determine transport properties of such samples.

The oil industry makes extensive use of various transport properties of earth formations to determine the amount of hydrocarbon reserves and the producibility of these reserves. Among these transport properties of earth formations are diffusion coefficients, electrical resistivity factors and permeability to fluid flow. These properties relate to Fick's law concentration transport, electric current transport, and hydraulic fluid transport, respectively, through porous and permeable earth formations, or representative samples thereof.

The oil industry makes extensive use of electrical resistivity well logging for open hole evaluation of the oil saturation in earth formations. In the interpretation of electrical resistivity well logs, the major unknown quantity is often the formation resistivity factor, F. The formation resistivity factor measures the influence of pore structure on the resistance of the sample. F is defined via Archie's relation:

$$C_o = S_w^n (1/F) C_w \qquad (1)$$

where:
$C_o$ is the conductivity of the formation, $S_w$ is the brine saturation, n is the saturation exponent, F is the formation resistivity factor, and $C_w$ is the brine conductivity.

When the oil saturation is zero, this equation reduces to:

$$C_o = (1/F) C_w \qquad (2)$$

The electrical resistivity well log measures the formation conductivity, $C_o$. The brine conductivity $C_w$ is often known from produced brine or can be estimated from other logs such as the spontaneous potential log. The saturation exponent n is approximately equal to 2. Thus, a major unknown quantity needed for accurate well log evaluation is the formation resistivity factor, F. Once F is known, the brine saturation, $S_w$, and the hydrocarbon saturation, $S_o = 1 - S_w$, can then be determined from the electrical resistivity well logs. The basic equations above are often modified to reflect the presence of clay minerals inside the pore space of the earth formation, as is well known in the art. For example, the Waxman-Smits equation for water-saturated shaly sands is $$C_o = (1/F)(C_w + BQ_v),$$

where B is the equivalent conductivity of the clay exchange counterions and $Q_v$ the cation exchange capacity of the clay minerals. Similarly, for oil bearing shaly sands the Waxman-Smits equation is:

$$C_o = S_w^n/F[C_w + (BQ_v/S_w)].$$

In order to determine the formation resistivity factor, earth material is cored from the well of interest and then analyzed in a laboratory. The laboratory procedure for measuring formation resistivity factor is to first drill small core plugs from the core sample. The core plugs are then cleaned of all oil and brine in extraction vessels, such as Dean-Stark extractors, which are well known in the art. The core plugs are then saturated with a plurality of brines of known conductivities, and the resistivity of the core plugs are measured while saturated with each brine.

For core samples that contain clay minerals, long periods of time are required for the core sample to equilibrate with the injected brines. Since this is a slow and laborious procedure, the formation resistivity factor is usually measured only for a relatively few core plugs representing the entire cored interval, which may be several hundred feet. Clearly this leads to large statistical uncertainties due to the small number of samples. In addition, this method does not display the spatial variations of the formation resistivity factor within, or along, the core.

The oil industry is of course also interested in determining the hydraulic permeability of a core sample, which is a measure of its ability to sustain fluid flow under an applied pressure gradient. The permeability is defined from Darcy's law:

$$Q = \frac{KA}{\mu} \frac{\Delta P}{\Delta L}$$

where Q is the fluid flow in $cm^3$/sec, K is the permeability in Darcy's, A is the cross-sectional area in square $cm^2$, $\Delta P/\Delta L$ is the pressure gradient in atmospheres across a length $\Delta L$ in cm, and $\mu$ is the viscosity in centipoise. The permeability K is measured in the laboratory on core plugs by confining the plugs in a sleeve, applying a known pressure gradient, and measuring the flow rate. Again, as in laboratory measurements of formation resistivity factor, the procedure is laborious, time-consuming, expensive, and suffers from small numbers of samples.

These and other limitations and disadvantages of the prior art are overcome by the present invention, however, and an improved method for determining transport characteristics of porous samples with NMR imaging is provided.

SUMMARY OF THE INVENTION

In a preferred embodiment of the present invention, new NMR imaging techniques are employed to determine transport characteristics of a porous sample. More specifically, two NMR images of the same section of the porous sample may be obtained to determine transport properties in that section. One such image, denoted I, is preferably obtained with the nuclear spins allowed to dephase for a first preselected time $\tau$ with zero applied field gradient. The second image, denoted I'', is preferably obtained under identical conditions except that the nuclear spins are allowed to dephase for the first preselected time $\tau$ with an applied field gradient, G'. These two images are saved on any appropriate storage media, such as magnetic tape, or disk.

The diffusion coefficient D' in the porous medium may then be computed from the ratio of the logarithms of these two images, using appropriate computational means, such as a minicomputer, as follows:

$$D' = (3/2)\gamma^{-2} G'^{-2} \tau^{-3} \ln(I/I'), \qquad (3)$$

where $\gamma$ is the gyromagnetic ratio of the nucleus being imaged, $G'$ is the applied field gradient used during the second image, and $\tau$ is the interpulse time during which the spins are allowed to dephase with and without the field gradient. The above computation is performed on a pixel-by-pixel basis for the image. That is, if the image array contains mXn elements or pixels, the mathematical operations are performed on the two intensity values (I and I") for each pixel location in the image array. This gives an mXn array of values of the diffusion coefficient $D'$ of the porous medium.

The formation resistivity factor may then be computed from:

$$F = (D_o/D') \quad (4)$$

where $D_o$ is the bulk-diffusion coefficient of the nuclei being imaged in the fluid saturating the porous media. For protons in water, $D_o$ is $2.3 \times 10^{-5}$ cm$^2$/sec at 25° C. This computation of formation resistivity factor from diffusional flow is based on the formal analogy between diffusion and electrical conductivity in porous media. (See Klinkenberg, L. J. "Analogy between diffusion and electrical conductivity in porous rocks", Bull. Geol. Soc. of America, June 1961, Vol. 62, pp. 559–564.) This computation may also be performed for each image pixel to obtain an image of formation resistivity factors.

The hydraulic permeability may be estimated from the mean pore size of the sample by measuring the restricted diffusion coefficient caused by pore wall restrictions. Either formation resistivity factors or permeabilities may be obtained by using variable interpulse times $\tau$ until the diffusion coefficent becomes independent of $\tau$.

It is an object of the present invention to provide a method for determining the diffusion coefficient, formation resistivity factor, and permeability of a core or other porous materials employing NMR imaging techniques.

It is also an object of the present invention to provide a method for determining the spatial variation of diffusion coefficient, formation resistivity factor, and permeability of a core or other porous materials.

It is also an object of the present invention to provide a method for determining the anisotropy of diffusion coefficient, formation resistivity factor, and permeability of a core or other porous materials.

It is a further object of the present invention to provide a method for nondestructively measuring transport properties of a core sample, or other porous and permeable materials.

Accordingly, these and other objects and advantages of the present invention will become apparent from the following detailed description, wherein reference is made to the Figures in the accompanying drawings.

DETAILED DESCRIPTION OF PREFERRED EMBODIMENTS

Figure 1:
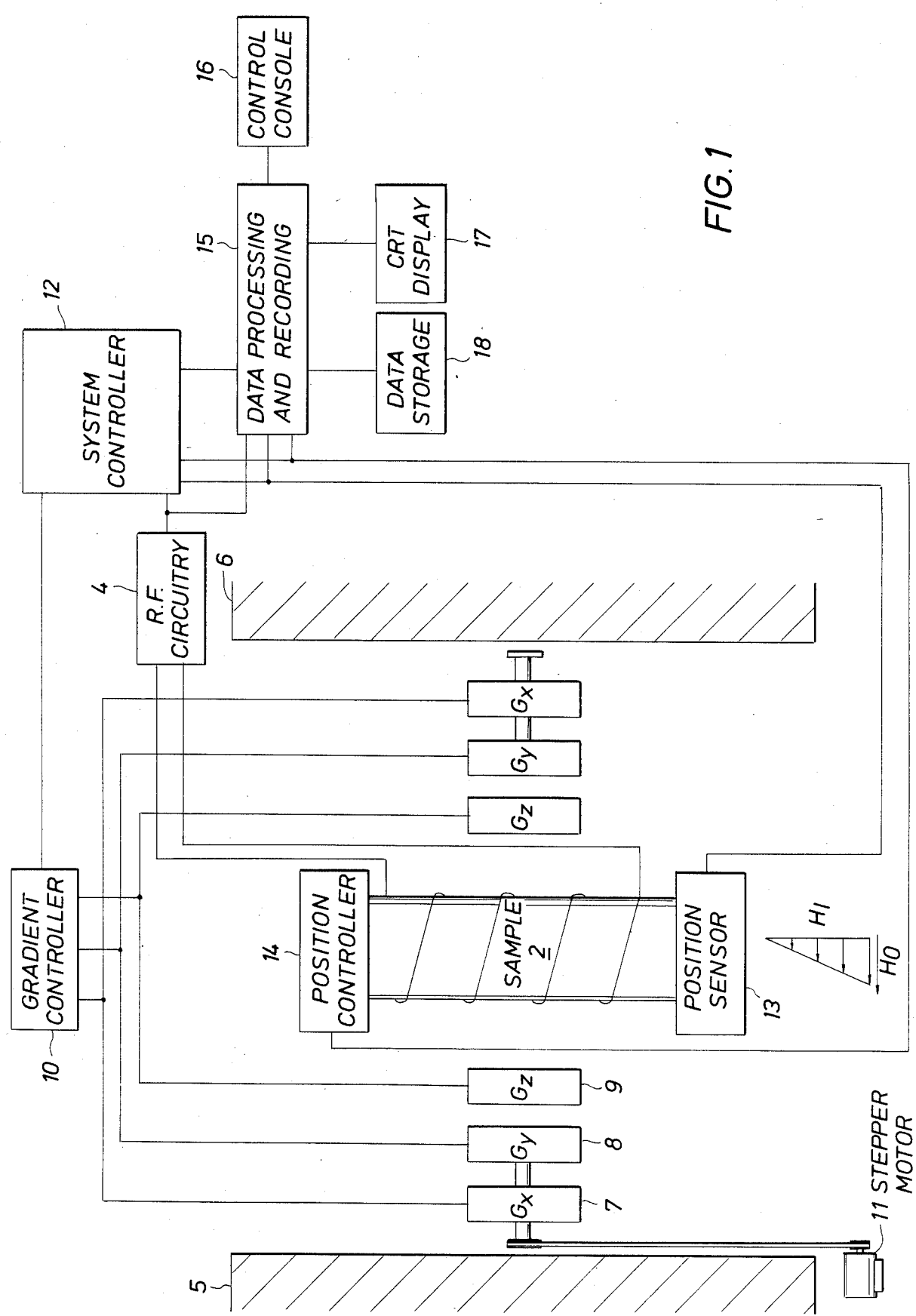
FIG. 1 depicts an NMR imaging device that may be employed to practice the method of the invention.

Referring now to FIG. 1 there may be seen a simplified functional drawing of an NMR imaging apparatus suitable for practicing the methods of the present invention. In particular, FIG. 1 shows a specimen (2) inside radio frequency coil (3) which is connected to radio frequency circuitry (4). An essentially constant magnetic field $H_o$ is produced by poles (5) and (6) of a magnet, which may be a permanent magnet, an electromagnet, or a superconducting magnet. The main magnet field $H_o$ is preferably between 0.1–4.0 Tesla although both higher and lower field strengths may be successfully employed. However, the method is often best practiced at lower field strengths to reduce local field inhomogenity because the spin-spin relaxation time $T_2$ decreases as the field is increased.

Gradient field coils (7), (8), (9) for x, y, and z directions, respectively, which are controlled by gradient controller (10), may be employed to produce an additional magnetic field $H_1$, which may be a spatially dependent linear gradient, appropriately oriented along the x, y, or z direction. The gradient controller (10) changes the gradient field electronically by varying the current to the gradient field coils, or it may alternatively control a stepper motor (11) to mechanically rotate the gradient field coils.

System controller (12) controls the radio frequency circuitry (4) and gradient controller (10). System controller (12) also receives data on the position of specimen (2) through position sensor (13) and controls the position of the specimen (2) with position controller (14). System controller (12) also interfaces with data processing and recording means (15). Data processing and recording means (15) receives data from the radio frequency circuitry (4) and position sensor (13). Control console (16), CRT display (17), and data storage means (18) also interface with the data processing and recording means (15). Such NMR imaging apparatus are well known in the art and is depicted for explanatory purposes.

NMR imaging wss first proposed by P. C. Lauterbur in *Nature*, Vol. 242, Mar. 16, 1973, pp. 190–191. In NMR imaging, a linear magnetic field gradient is applied to a sample so that the resonant frequencies of nuclear spins depend on the spatial location of those spins. The Fourier transform of the detected NMR spectrum represents the projection of the nuclear spin density $M_o$ perpendicular to the direction of the applied field gradient. A two- or three-dimensional image is constructed from a number of these projections at different angles.

In addition to nuclear spin density $M_o$, NMR imaging can also image various spin relaxation times, such as $T_1$, the spin-lattice relaxation time, and $T_2$, the spin-spin relaxation time. In addition, NMR imaging can image chemical shift spectra. A comprehensive review of NMR imaging can be found in the book, *NMR Imaging In Biomedicine*, by P. Mansfield and P. B. Morris, Academic Press, 1982.

However, NMR imaging has not been used to determine diffusion coefficients, formation resistivity factors, or permeability of porous materials. The methods of the present invention modify conventional NMR imaging methods so that these transport properties can be imaged on porous samples in a rapid, continuous and nondestructive manner.

Figure 2:
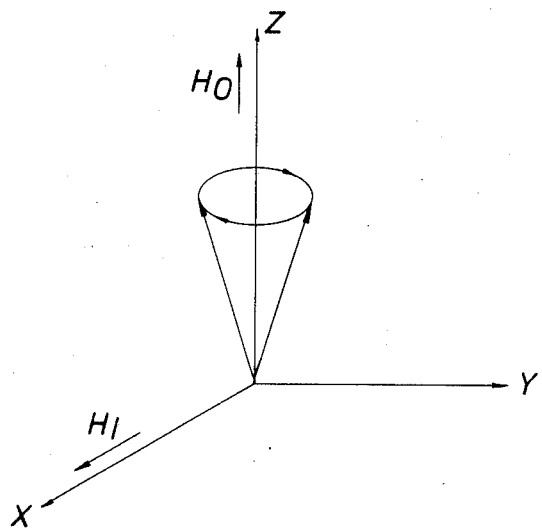
FIG. 2 depicts an orthogonal coordinate system in the NMR rotating frame.

Practice of the methods of the present invention involves placing a specimen (2) in coil (3) and imaging a slice, plane, or volume of specimen (2). Referring now to FIG. 2, there is defined a coordinate system OX, OY, OZ in the frame rotating with angular velocity $\omega = \gamma H_o$, where O is the origin at the center of the coil and the Z axis is along the main magnetic field $H_o$, and $\gamma$ is the gyromagnetic ratio of the nuclear spin. For a proton, $\gamma$ is 4.26 MHz/kilogauss. At thermal equilibrium the nuclear spin magnetization $M_o$ is directed along $H_o$.

Figure 3:
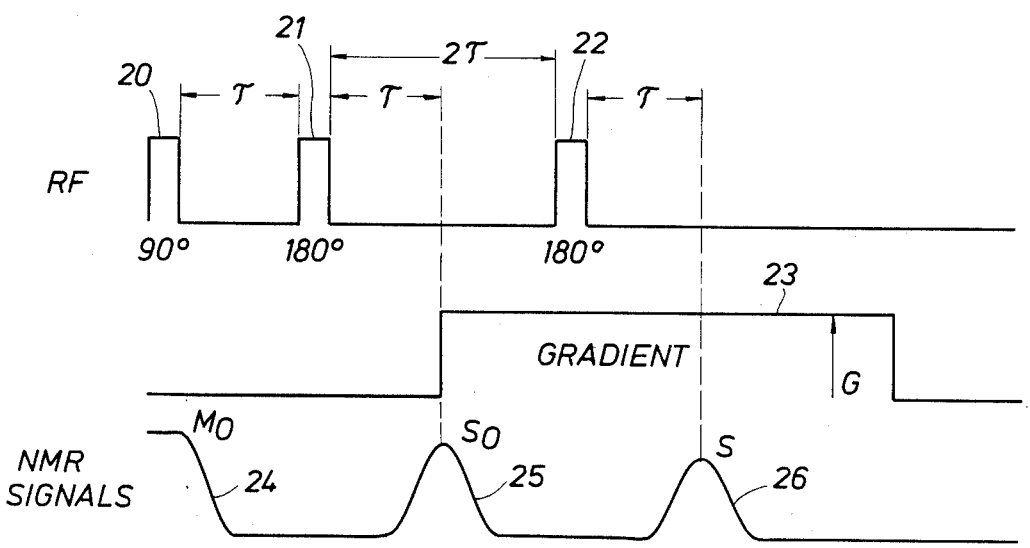
FIG. 3 depicts the radio frequency pulse sequences, field gradient sequences, and detected NMR intensities employed in a preferred method of the present invention.
Figure 3:
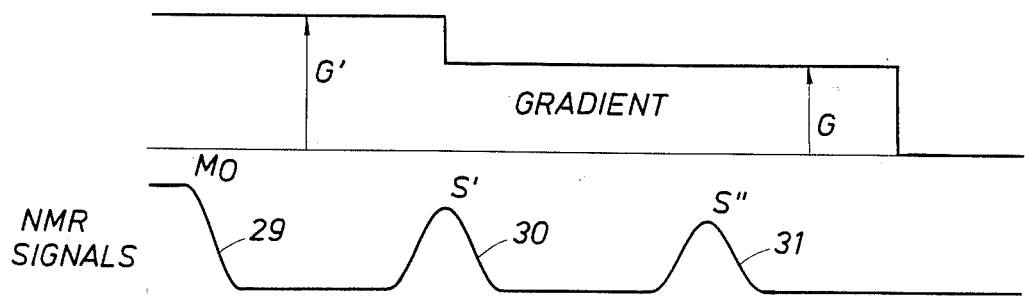

FIG. 3 shows the preferred embodiment of the radiofrequency pulse sequence, magnetic field gradients, and detected NMR signals. Typical gradient field strengths of 1-10 gauss/cm may be used. In FIG. 3, a 90 degree radio frequency pulse (20) is applied at an initial time, i.e. t=0, directed along an axis OY. This is followed by a series of refocusing 180 degree pulses directed along the axis OX, the first (21) at a first preselected time, $t=\tau$, the second (22) at a second preselected time determined in functional relationship with the first time, $t=3\tau$. During the first part of the measurement sequence, the magnetic field gradient is off until a third preselected time determined in functional relationship with the first time, $t=2\tau$. The imaging magnetic field gradient G (23) is switched on at this third preselected time $t=2\tau$ and remains on during the imaging. The detected NMR intensity from this spin-echo pulse sequence consists of a signal at t=0 with intensity $M_o$ (24), a signal $I_o$ at the third preselected time $t=2\tau$ (25) of intensity:

$$I_o = M_o \exp(-2\tau/T_2) \qquad (5)$$

and a signal I at a fourth preselected time determined in functional relationship with the first time, $t=4\tau$ (26) of intensity:

$$I = I_o \exp(-\tfrac{2}{3}\gamma^2 G^2 D'\tau^3) \exp(-2\tau/T_2) \qquad (6)$$

The intensity I (26) contains the additional factor, $$\exp(-\tfrac{2}{3}\gamma^2 G^2 D'\tau^3) \qquad (7)$$

due to diffusion that occurs during the time the magnetic field gradient is on. (See Abragam, A. "The Principles of Nuclear Magnetism", Oxford, Clarendon Press, 1961. specifically at p. 51, equation 48"). The intensities of each of the NMR signal (24), (25) and (26) is appropriately stored, i.e recorded by data processing and recording means (15).

This same measurement sequence is repeated to determine the second image of the method of the present invention, i.e. using the same radio frequency pulse sequence (20), (21), and (22). However, during the time from the initial time to the third preselected time, i.e. $t=0$ to $t=2\tau$, a magnetic field gradient G' (28) may now be applied across the specimen (2) before the imaging magnetic field gradient G (28) is applied. The gradient G' may be much larger than the imaging gradient G and need not have the same spatial direction. For example, G' could be 20 gauss/cm directed along X axis, while G is only 5 gauss/cm and directed along Y axis. As the magnitude of G is increased the value of D' that can be measured by the methods of the invention decreases. The imaging magnetic field gradient G is preferably the same as that used to obtain the first image of the measurement. The detected NMR intensity from the second measurement sequence consists of NMR signal (29) at an initial time t=0, NMR signal I' (30) at the third preselected time $t=2\tau$ of intensity:

$$I' = I_o \exp(-\tfrac{2}{3}\gamma^2 G'^2 D'\tau^3), \qquad (7)$$

and NMR signal I" (31) at the fourth preselected time, $t=4\tau$ of intensity:

$$I'' = I' \exp(-\tfrac{2}{3}\gamma^2 G^2 D'\tau^3) \exp(-2\tau/T_2) \qquad (8)$$

Each of the NMR signals (29), (30), (31) is appropriately stored, i.e. recorded on data processing and recording means (15).

The data processing and recording means (15) computes the diffusion coefficient D' from the intensities I from the first image and I" (from the second image) using the relation:

$$D' = (3/2)\gamma^{-2} G'^{-2} \tau^{-3} \ln(I/I'') \qquad (9)$$

Note that this expression for D' does not depend on the spin-spin relaxation time $T_2$ nor on the strength of the imaging gradient G. These two measurements may then be repeated with additional values of G', and a linear regression fit used to determine D' for the multiple value of G'. This D' may be determined for each pixel of the image simply by acquiring two images derived from the two spin echoes I and I". A D' image can now be made from the diffusion coefficients of the specimen using the values of D' computed pixel-by-pixel for the image.

Figure 4:
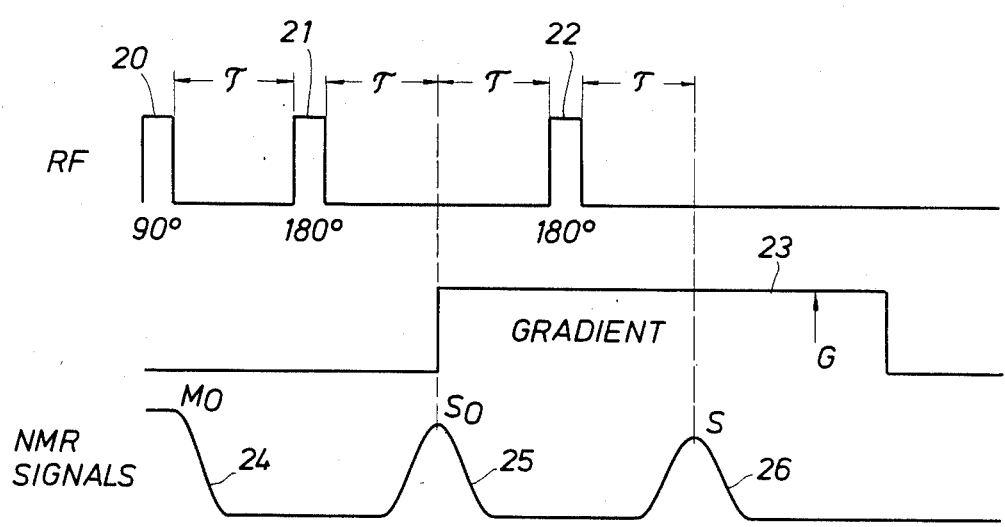
FIG. 4 depicts an alternative field gradient sequence utilizing short pulse gradients.
Figure 4:
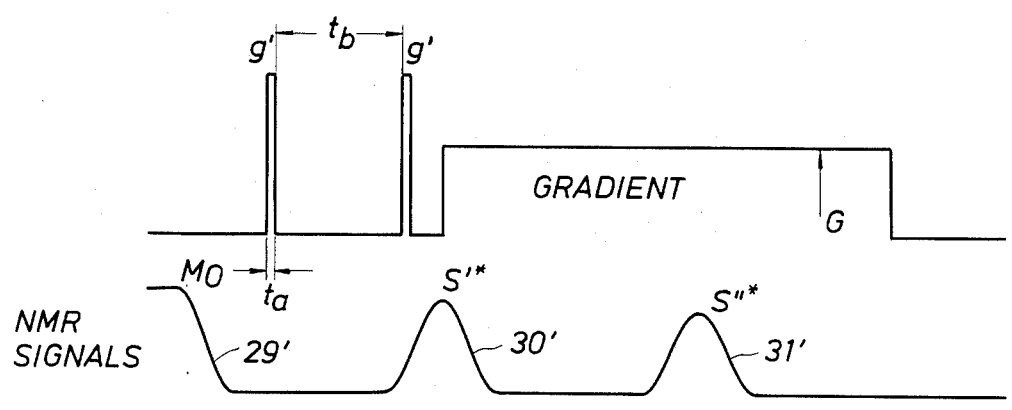

FIG. 4 depicts an alternative gradient sequence for obtaining images of diffusion coefficients. The method for the first image is as depicted and described hereinbefore. The second image employs two short (time) pulse gradients 8', one between $t=0$ and $t=\tau$ and the other between $t=\tau$ and $t=2\tau$, as depicted in FIG. 4. The pulses are present for a short time, $t_a$ and separated by a time, $t_b$. The resulting equation corresponding to equation 8 is $$I'' = I' \exp(-\tfrac{2}{3}\gamma'^2 g'^2 D' t_a^2 t_b) \exp(-2\tau/T_2) \qquad (8')$$

and similarly for equation 9, $$D' = \gamma^{-2} g'^{-2} t_a^{-2} t_b^{-1} \ln(I/i'') \qquad (9')$$

This pulsed gradient method is less sensitive to precise timing and phasing than that depicted and described in FIG. 3. The pulsed gradients may be located any time between ($t=0$ and $t=\tau$) and ($t=\tau$ and $t=2\tau$) and may be of any length less than $\tau$.

Once D' is calculated, then the formation resistivity factor, F, may be computed for each pixel in the image from the expression:

$$F = D_o/D' \qquad (10)$$

where $D_o$ is the bulk-diffusion coefficient of the nuclei being imaged. For example, at 25° C. the self-diffusion coefficient of bulk water is $2 \times 10^{-5}$ cm$^2$/sec. The correspondence between electrical transport and diffusional transport, on which this equation relies, has been substantiated by the Klinkenberg reference noted hereinbefore.

In the equations noted hereinbefore, the diffusion coefficient D' of the porous media was assumed to be isotropic. In practice, however, porous materials (specifically core samples) may exhibit significant electrical and diffusional anisotropy, which is often useful petrophysical information. If the specimen is anisotropic, the quantity measured is the diffusion coefficient in the direction of the applied field gradient G'. Thus the second image of the measurement procedure can be repeated with G' oriented along each of three orthogonal directions, to measure the diffusion coefficients along these directions and accordingly, the formation resistivity factor along those directions.

Although water has been mentioned specifically in the foregoing preferred embodiment, this invention may image any fluid saturating the pores of the specimen (2), for example oil, toluene, etc. In these cases, $D_o$ is the bulk-diffusion coefficient of the nucleus imaged in fluid saturating the specimen (2). In addition, other nuclei besides the proton can be imaged, e.g., $F^{19}$ or $Na^{23}$. Thus, if the fluid saturating the specimen (2) is NaF salt dissolved in water, and if the fluorine nucleus is imaged, then the appropriate value of $D_o$ is the diffusion coefficient of fluoride ion in water at the temperature of the experiment. If the sodium ion is imaged, then the appropriate value of $D_o$ is the diffusion coefficient of sodium ion in water at the temperature of the experiment.

Thus, a spatial formation resistivity factor may be calculated for each pixel in a plane and for each plane along the specimen (2), to provide the formation resistivity factor at any point in specimen (2). A 3-dimensional image of the formation resistivity factor is obtained which may be displayed on CRT (17), or videotape, or alternatively a hardcopy may be obtained as photograph or from a color plotter.

Such a formation resistivity factor may be obtained even if clay minerals are present, by the methods of the present invention. If water is used to saturate the specimen (2) and the proton is imaged, the presence of clay minerals does not alter the determination of formation resistivity factors employing the methods of the present invention since the clay minerals do not contribute to the self-diffusion of protons of bulk water.

However, if NaF brine is utilized and the sodium ion is imaged, the transport of sodium ion is reduced by the clays and this effect is included in the computed formation resistivity factor. In particular, if NaF brine is utilized in a shaly sand and both the sodium and the proton nuclei are imaged to obtain the diffusion coefficients of sodium and proton, the sodium diffusion coefficient will be reduced by the clays whereas the proton diffusion coefficient with be unaffected. The magnitude of the difference between the diffusion coefficients will depend on the cation exchange capacity of the clays in the sample, $Q_v$. Thus, the cation exchange capacity of the clays $Q_v$ may be imaged as well as their contribution to the sample conductivity.

As noted hereinabove, the preferred imaging technique is the spin-echo technique. However, other NMR pulse techniques may be employed in the method of the present invention. Similarly, other imaging schemes may be employed to obtain the second image of the imaging sequence hereinabove, for example, but not limited to Fourier imaging, spin-warp imaging, etc. Similarly, the sequence of the first and second images of may be reversed. These and other imaging schemes are well known in the art of NMR imaging.

When the spin-echo technique is employed in sedimentary rocks, the first preselected time, or pulse delay time, $\tau$, should be selected sufficiently long to allow for a diffusion path long compared to the maximum pore size in the specimen. At 25 degrees C., the root mean square diffusion distance in about 20 milliseconds is about 14 microns. For typical sedimentary rocks of interest in petroleum engineering, times greater than 50 milliseconds have been found to be sufficiently long, unless the specimens have a very high permeability. The imaging procedure may be repeated with increasingly long first preselected times $\tau$ until D' decreases from $D_o$ and finally becomes independent of pulse delay time $\tau$. This final value of D' may then be used to calculate the formation resistivity factor.

Figure 5:
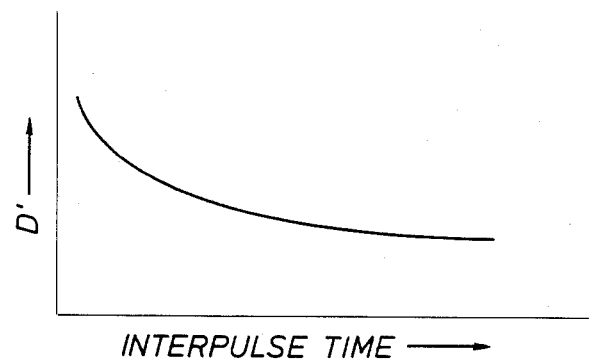
FIG. 5 plots the decrease in diffusion constant versus interpulse delay time for a brine-saturated Berea sandstone.

The value of the first preselected time, $\tau$ at which D' is independent of $\tau$ is a measure of the largest pore sizes present in the specimen. For short enough interpulse times a molecule has insufficient time to diffuse to a pore wall and hence its diffusion coefficient is not restricted by the pore walls. The rms average time $t_D$ required to diffuse to the pore walls for a spherical pore is given by:

$$t_o = R^2/6D_o \tag{11}$$

where R is the radius of the pore and $D_o$ is the bulk diffusion coefficient. If the method of the present invention is repeated several times with increasing interpulse times, the smallest $\tau$ at which D' becomes independent of $\tau$ can be determined, which is $t_D$. This is shown in FIG. 5. This value of $\tau$ can then be converted to an average or effective value of pore size R using equation (11) for each pixel in the image of the specimen (2). Thus, an image of the pore sizes in the specimen may be created by data processing and recording means (15) based upon the foregoing method of the present invention. The image of the pore sizes can be displayed on CRT (17), or hardcopy photographs or color plots may be made.

Once the pore size is known, an approximate value of the specimen's fluid permeability K can be determined using the empirical expression:

$$K = c(1/F)R^2 = cD't_D \tag{12}$$

where c is a constant, and the formation resistivity factor (F) and diffusion coefficient in the porous specimen (D') have been measured as noted hereinbefore. The constant c is approximately 20 if K is in millidarcies, R is in microns, and D' is in micron$^2$/sec. Again, this computation is performed pixel-by-pixel on the image of the specimen. Thus, an image of the approximate fluid permeability of the specimen may be created by data processing and recording means (15). The image of the fluid permeability may also be displayed on CRT (17), videotape, or hardcopy photographs or color plots may be made.

In addition to imaging core samples from earth formations, this invention may also be applied to other porous materials such as soil, concrete, etc. Also, the invention may be employed to image diffusion coefficients in liquid and/or gaseous samples that may not be enclosed in porous media. The methods of the invention provide images of the electrical, diffusional and/or hydraulic properties of any material containing mobile nuclei which have a nuclear magnetic moment.

Many other variations and modifications may be made in the techniques hereinbefore described, by those having experience in this technology, without departing from the concept of the present invention. Accordingly, it should be clearly understood that the method depicted in the accompanying drawings and referred to in the foregoing description are illustrative only and are not intended as limitations on the scope of the invention.

What is claimed is:

1. A method for determining spatial transport characteristics of a subsurface earth specimen, comprising:

NMR imaging said specimen with a constant magnetic field and with a zero applied field gradient and, then MMR imaging said specimen with a constant magnetic field and with a non-zero applied field gradient.

2. A method for determining the diffusion coefficient of a porous material, comprising:

NMR imaging said material with a constant magnetic field to determine a first spatial image and then NMR imaging said material with a constant magnetic field and a gradient magnetic field to determine second spatial image, and functionally combining the intensities of said first and second image for each corresponding pixel of said spatial images to provide a spatial image of said diffusion coefficient.

3. The method of claim 2, wherein said material is an earth sample.

4. The method of claim 3, wherein said earth sample is a core sample.

5. A method for determining the formation resistivity factor of a porous material, comprising:

NMR imaging said material with increasing interpulse times with a constant magnetic field to determine a first spatial image and then NMR imaging said material with said increasing interpulse times with a constant magnetic field and a gradient magnetic field to determine a second spatial image, determining from said first and second spatial image a diffusion coefficient independent of interpulse time variation for each pixel of said spatial image, determining the bulk diffusion coefficient of the nuclei being imaged, and functionally combining said bulk diffusion and diffusion coefficients to provide a spatial image of said formation resistivity factor.

6. The method of claim 5, wherein said material is an earth sample.

7. A method for determining mean pore size of a porous material comprising:

NMR imaging said material with increasing interpulse times to determine the smallest interpulse time for which a diffusion coefficient becomes independent of interpulse time, determining the bulk diffusion coefficient of the nuclei being imaged, and functionally combining said interpulse time and bulk diffusion coefficient to provide a spatial image of said mean pore size.

8. A method for determining permeability of a porous material, comprising:

NMR imaging said material with increasing interpulse times to determine the smallest interpulse time for which a diffusion coefficient becomes independent of interpulse time, and functionally combining said smallest interpulse time and diffusion coefficient to provide a spatial image of said permeability.

9. A method for determining permeability of a porous material, comprising:

NMR imaging said material with increasing interpulse times to determine the smallest interpulse time for which a diffusion coefficient becomes independent of time, determining a bulk diffusion coefficient, and functionally combining said smallest interpulse time, and said bulk diffusion and diffusion coefficients to provide a spatial image of said permeability.

* * * * *